(12) United States Patent
Kono et al.

(10) Patent No.: US 9,882,036 B2
(45) Date of Patent: Jan. 30, 2018

(54) SEMICONDUCTOR DEVICE

(71) Applicant: KABUSHIKI KAISHA TOSHIBA, Tokyo (JP)

(72) Inventors: Hiroshi Kono, Himeji Hyogo (JP); Takuma Suzuki, Himeji Hyogo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 15/246,193

(22) Filed: Aug. 24, 2016

(65) Prior Publication Data
US 2017/0271467 A1 Sep. 21, 2017

(30) Foreign Application Priority Data

Mar. 16, 2016 (JP) .................. 2016-053107

(51) Int. Cl.
| | | |
|---|---|---|
| *H01L 29/739* | (2006.01) | |
| *H01L 29/45* | (2006.01) | |
| *H01L 29/16* | (2006.01) | |
| *H01L 29/06* | (2006.01) | |
| *H01L 29/10* | (2006.01) | |

(Continued)

(52) U.S. Cl.
CPC ...... *H01L 29/7397* (2013.01); *H01L 29/0696* (2013.01); *H01L 29/1095* (2013.01); *H01L 29/1608* (2013.01); *H01L 29/45* (2013.01); *H01L 29/66325* (2013.01); *H01L 29/7395* (2013.01); *H01L 29/7802* (2013.01)

(58) Field of Classification Search
CPC ............. H01L 29/0696; H01L 29/1095; H01L 29/66325; H01L 29/7302; H01L 29/7393; H01L 29/7395; H01L 29/7397; H01L 2924/13055
See application file for complete search history.

(56) References Cited

U.S. PATENT DOCUMENTS 5,891,776 A * 4/1999 Han .................... H01L 29/1095
257/E21.382
8,525,254 B2 9/2013 Treu et al.
8,754,422 B2 6/2014 Kudou et al.
(Continued)

FOREIGN PATENT DOCUMENTS

WO 2011/048800 A1 4/2011

*Primary Examiner* — Eduardo A Rodela
(74) *Attorney, Agent, or Firm* — Patterson & Sheridan, LLP

(57) ABSTRACT

A semiconductor device includes first and second electrodes and a silicon carbide layer located between the first and second electrodes. A plurality of gate electrodes is interposed between the first electrode and the silicon carbide layer and extends in a first direction. The silicon carbide layer includes a plurality of spaced apart openings having sidewalls and a base which extend inwardly between the gate electrodes, a first region containing a second conductivity type impurity extending around and under the openings, and a second region containing a second conductivity type impurity interposed between the portion of the first region extending under the base of the openings. The concentration of the second conductivity type impurity is greater in the second region than in the first region. The silicon carbide layer includes a third region containing a first conductivity type impurity extending inwardly of the first region from the sidewall of the openings.

16 Claims, 6 Drawing Sheets

(51) Int. Cl.
*H01L 29/78* (2006.01)
*H01L 29/66* (2006.01)

(56) References Cited

U.S. PATENT DOCUMENTS

| | | |
|---|---|---|
| 8,987,812 B2 | 3/2015 | Kono et al. |
| 9,178,055 B2 | 11/2015 | Tanaka et al. |
| 9,627,517 B2 * | 4/2017 | Schulze .............. H01L 29/7393 |
| 2012/0153303 A1 * | 6/2012 | Uchida ............. H01L 29/41766 |
| | | 257/77 |
| 2016/0260829 A1 * | 9/2016 | Aichinger ........... H01L 27/0629 |

* cited by examiner

SEMICONDUCTOR DEVICE

CROSS-REFERENCE TO RELATED APPLICATION

This application is based upon and claims the benefit of priority from Japanese Patent Application No. 2016-053107, filed Mar. 16, 2016, the entire contents of which are incorporated herein by reference.

FIELD

Embodiments described herein relate generally to a semiconductor device.

BACKGROUND

Silicon carbide is expected to be used as a material for a next generation semiconductor device. Silicon carbide has excellent physical properties in which the bandgap is three times as large as that of silicon, breakdown electric field strength is approximately ten times greater than that of silicon, and thermal conductivity is approximately three times as large as that of silicon. It is possible to achieve a semiconductor device with low loss and high-temperature operation using these characteristics.

In an n-type metal oxide semiconductor field effect transistor (MOSFET) using silicon carbide, it is preferable to reduce contact resistance between an n-type source region and an electrode in order to reduce on-state resistance. In addition, it is preferable to reduce contact resistance between a p-type body region and an electrode in order to improve avalanche resistance.

DETAILED DESCRIPTION

Figure 1:
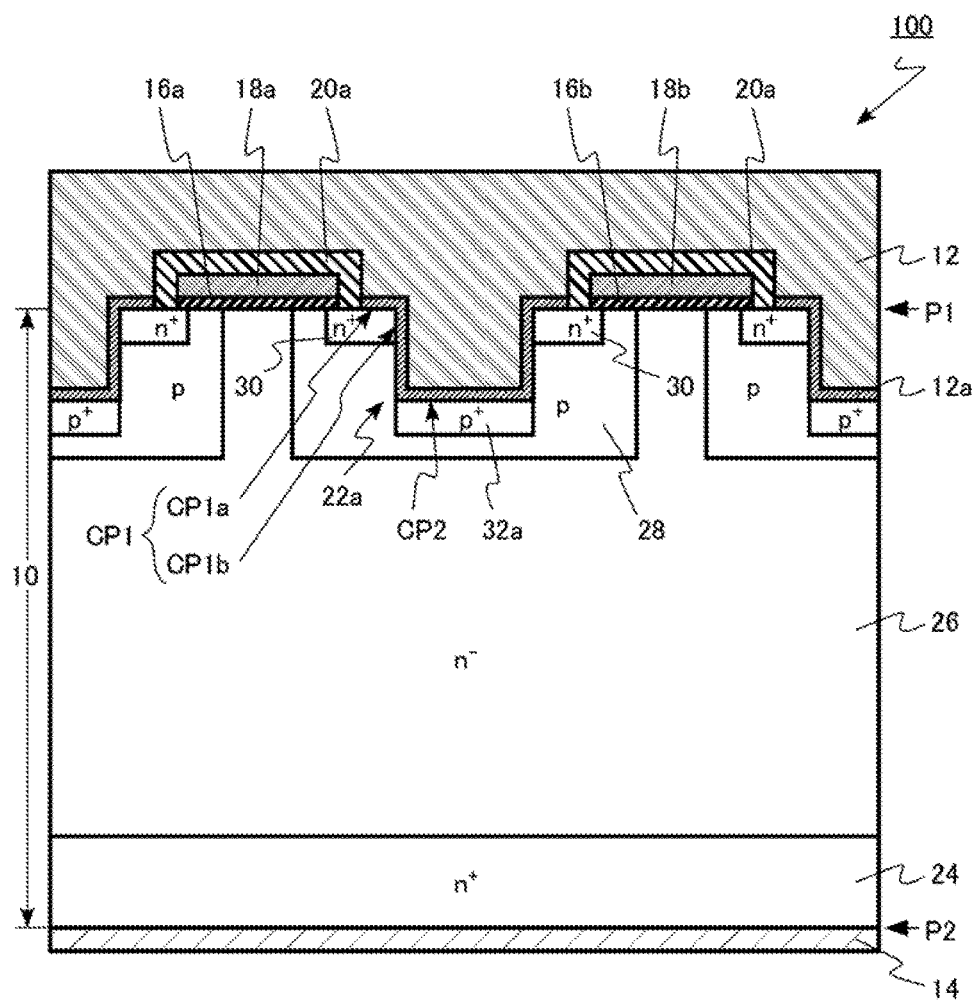
FIG. 1 is a schematic cross-sectional view of a semiconductor device according to a first embodiment.

According to an embodiment, there is provided a semiconductor device capable of reducing a contact resistance.

In general, according to one embodiment, there is provided a semiconductor device including a first electrode, a second electrode, a silicon carbide layer located between the first electrode and the second electrode, a plurality of gate electrodes interposed between the first electrode and the silicon carbide layer and extending thereon in a first direction and spaced from one another in a second direction, and a plurality of openings having sidewalls and a base which extend inwardly of the silicon carbide layer and located in an area between adjacent gate electrodes in the second direction and spaced apart from one another in the first direction. At least a portion of the first electrode extends inwardly of the openings. The silicon carbide layer includes a first region containing a second conductivity type impurity therein extending around, and under the base of, the openings. The silicon carbide layer further includes a second region containing a second conductivity type impurity therein interposed between the portion of the first region extending under the opening and the base of the openings, wherein the concentration of the second conductivity type impurity is greater in the second region than in the first region. The silicon carbide layer further includes a third region containing a first conductivity type impurity therein extending inwardly of the first region from the sidewall of the openings.

Hereinafter, embodiments will be described with reference to the accompanying drawings. Furthermore, in the following description, the same reference numeral will be given to the same or similar members and the like, and description of members and the like, which are described once, will be appropriately omitted.

In the following description, notations of "$n^+$", "$n$", "$n^-$", "$p^+$", "$p$", and "$p^-$" represent relative magnitudes of impurity concentrations in respective conductivity types. That is, "$n^+$" represents that an n-type impurity concentration is relatively higher in comparison to "$n$", and "$n^-$" represents that the n-type impurity concentration is relatively lower in comparison to "$n$". Furthermore, "$p^+$" represents that a p-type impurity concentration is relatively higher in comparison to "$p$", and "$p^-$" represents that the p-type impurity concentration is relatively lower in comparison to "$p$". Furthermore, "$n^+$-type" and "$n^-$-type" may be simply described as "n-type", and "$p^+$-type" and "$p^-$-type" may be simply described as "p-type".

For example, the impurity concentration can be measured by the secondary ion mass spectrometry (SIMS). In addition, for example, the relative magnitude of the impurity concentration can be determined from the magnitude of a carrier concentration that is obtained by the scanning capacitance microscopy (SCM). In addition, for example, a distance such as a depth of an impurity region can be obtained by SIMS. In addition, for example, the distance such as the depth of the impurity region can be obtained from a composite image of an SCM image and an atomic force microscope (AFM) image.

First Embodiment

Figure 2:
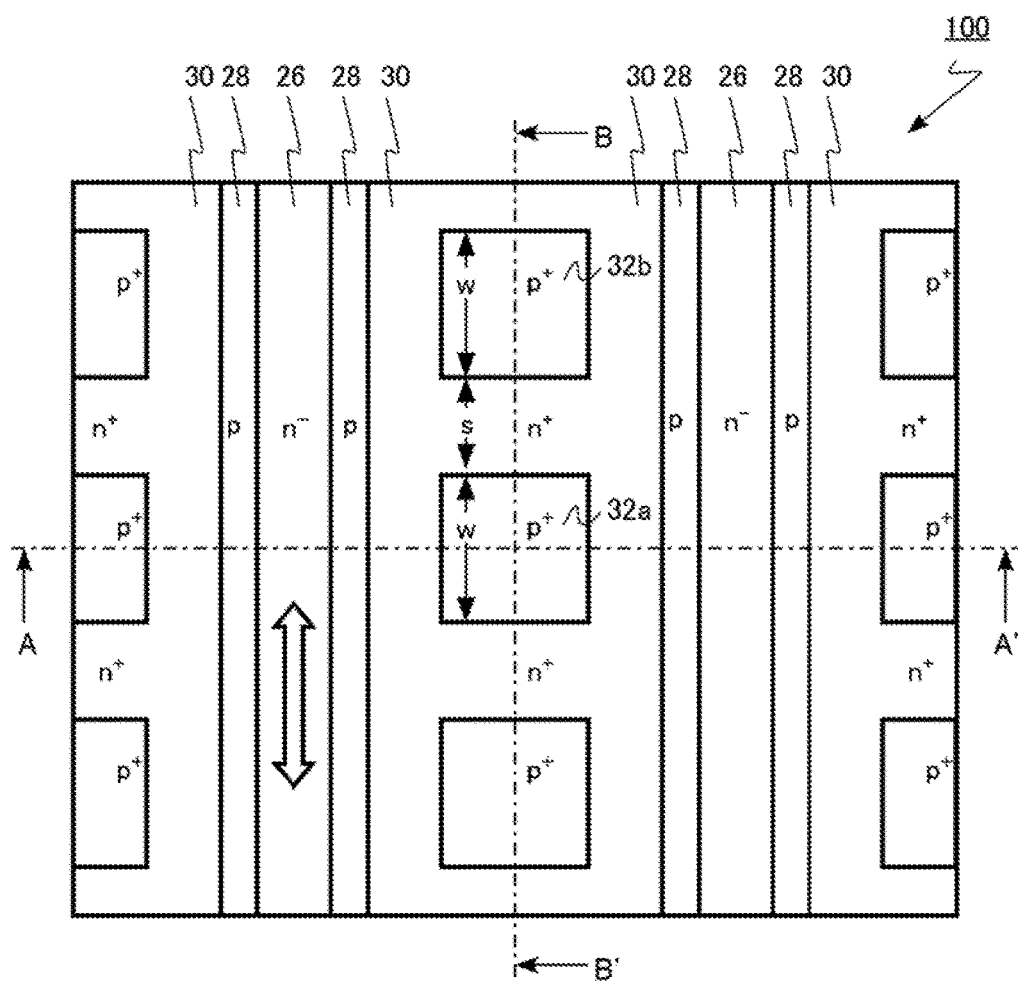
FIG. 2 is a schematic top plan view of the semiconductor device according to the first embodiment.
Figure 3:
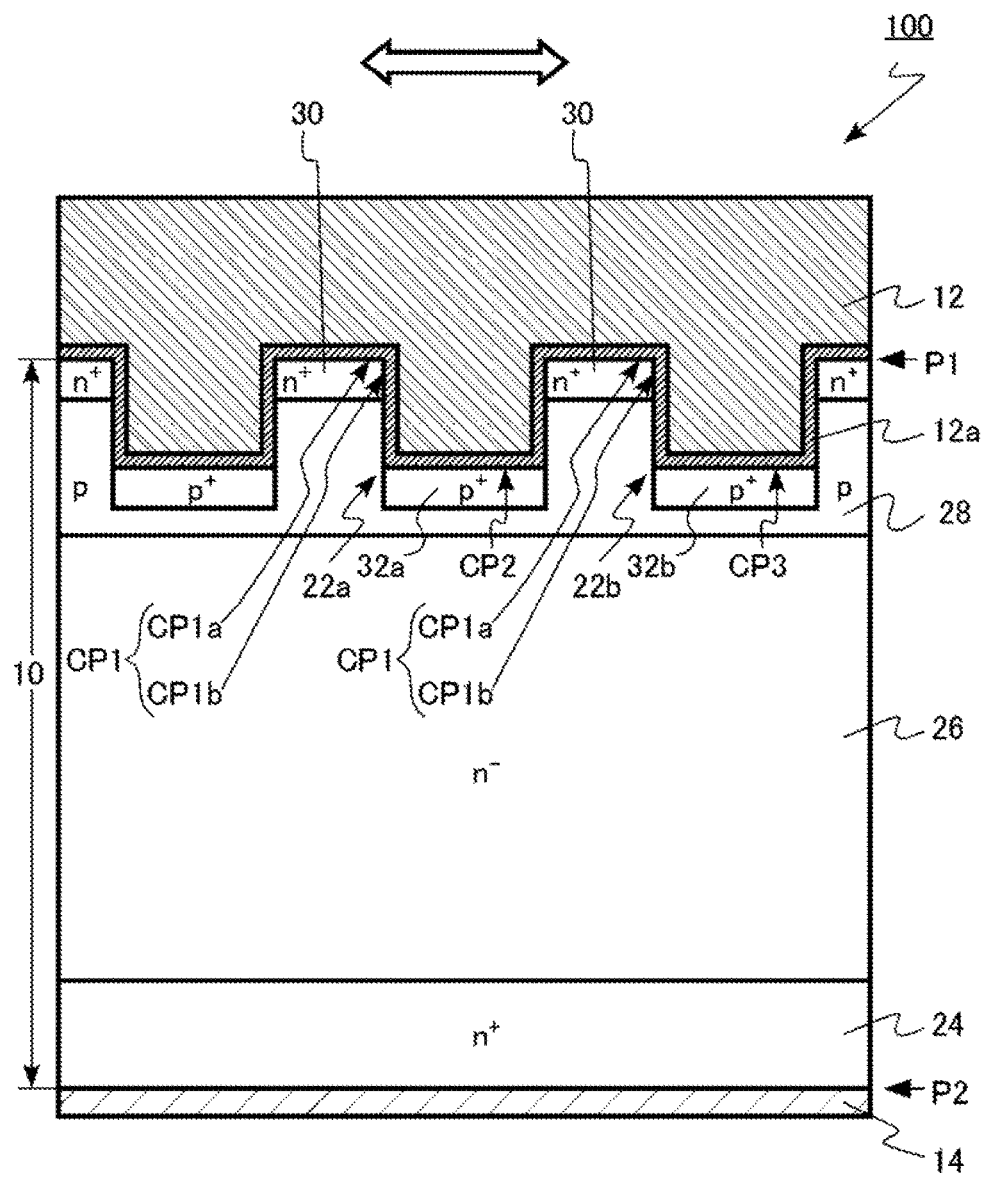
FIG. 3 is a schematic cross-sectional view of the semiconductor device according to the first embodiment.

FIG. 1 is a schematic cross-sectional view of the semiconductor device according to this embodiment. FIG. 2 is a schematic top plan view of the semiconductor device according to this embodiment. FIG. 3 is a schematic cross-sectional view of the semiconductor device according to this embodiment. FIG. 1 is a cross-sectional view taken along line A-A' in FIG. 2. FIG. 3 is a cross-sectional view taken along line B-B' in FIG. 2.

The semiconductor device according to this embodiment is a planar gate type vertical MOSFET 100 using silicon carbide. Hereinafter, description will be given of a case where a first conductivity type is an n-type and a second conductivity type is a p-type, as an example.

The MOSFET 100 includes a silicon carbide layer 10, a source electrode 12, a drain electrode 14, a first gate insulating film 16a, a second gate insulating film 16b, a first gate electrode 18a, a second gate electrode 18b, a first interlayer insulating film 20a, a second interlayer insulating film 20b, a first contact opening 22a, and a second contact opening 22b. The source electrode 12 includes a silicide region 12a.

An $n^+$-type drain region 24, an $n^-$-type drift region 26, a p-type body region 28, an $n^+$-type source region 30, a p+-type first body contact region 32a, and a p+-type second body contact region 32b are provided in the silicon carbide layer 10.

At least a portion of the silicon carbide layer 10 is provided between the source electrode 12 and the drain electrode 14. The silicon carbide layer 10 is single-crystal SiC. For example, the silicon carbide layer 10 crystal structure is 4H—SiC.

The silicon carbide layer 10 includes a first plane ("P1" in FIG. 1) and a second plane ("P2" in FIG. 1). Hereinafter, the first plane is referred to as a front surface, and the second plane P2 is referred to as a rear surface. Furthermore, hereinafter, "depth" represents a depth using the first plane as the baseline or 0 point.

For example, the first plane is inclined with respect to a (0001) plane of the crystal structure of the silicon carbide crystal by 0° to 8°. In addition, for example, the second plane is inclined with respect to a (000-1) plane by 0° to 8°. The (0001) plane is referred to as a silicon plane. The (000-1) plane is referred to a carbon plane.

The n+-type drain region 24 is provided at the rear surface side of the silicon carbide layer 10. For example, the drain region 24 contains nitrogen (N) as an n-type impurity. For example, the impurity concentration of the n-type impurity in the drain region 24 is $1\times10^{18}$ cm$^{-3}$ to $1\times10^{21}$ cm$^{-3}$.

The n−-type drift region 26 is provided on the drain region 24. For example, the drift region 26 contains nitrogen (N) as an n-type impurity. The impurity concentration of the n-type impurity in the drift region 26 is lower than the impurity concentration of the n-type impurity in the drain region 24. For example, the impurity concentration of the n-type impurity in the drift region 26 is $4\times10^{14}$ cm$^{-3}$ to $6\times10^{16}$ cm$^{-3}$. For example, the thickness of the drift region 26 is 5 µm to 150 µm.

The p-type body region 28 is provided between the source electrode 12 and the drift region 26. The body region 28 functions as a channel region of the MOSFET 100.

For example, the body region 28 contains aluminum (Al) as a p-type impurity. For example, an impurity concentration of the p-type impurity in the body region 28 is $1\times10^{7}$ cm$^{-3}$ to $5\times10^{17}$ cm$^{-3}$.

For example, a depth of the body region 28 is 0.3 µm to 0.8 µm.

The first and second gate electrodes 18a, 18b extend in a first direction on the silicon carbide layer 10, and are spaced apart thereon in a second direction generally orthogonal to the first direction. The first contact opening 22a and the second contact opening 22b (FIG. 3) are formed in the silicon carbide layer 10 between the first gate electrode 18a and the second gate electrode 18b. For example, the first contact opening 22a and the second contact opening 22b are formed by selectively etching the silicon carbide layer 10 inwardly of the front surface thereof by using a reactive ion etching (RIE) method.

The first contact opening 22a and the second contact opening 22b are separated from each other in the extending direction (direction indicated by a double sided arrow in FIG. 2 and FIG. 3) of the first gate electrode 18a and the second gate electrode 18b.

For example, a depth of the first contact opening 22a and the second contact opening 22b is 0.2 µm to 0.5 µm.

The n+-type source region 30 is provided between the source electrode 12 and the body region 28. A portion of each source region 30 is located in the silicon carbide layer 10 between the first gate electrode 18a and the second gate electrode 18b. The source region 30 is in contact with the silicide region 12a of the source electrode 12 at a first contact plane ("CP1" in FIG. 1 and FIG. 3).

The first contact plane CP1 includes a first region CP1a and a second region CP1b. The second region CP1b is inclined with respect to the first region CP1a. For example, the second region CP1b is a plane that is approximately perpendicular to the first region CP1a.

The first region CP1a is located at the front surface of the silicon carbide layer 10. On the other hand, the second region CP1b is located on a lateral surface of the first contact opening 22a or the second contact opening 22b.

For example, the source region 30 contains phosphorous (P) as an n-type impurity. An impurity concentration of the n-type impurity in the source region 30 is higher than the impurity concentration of the n-type impurity in the drift region 26.

For example, the impurity concentration of the n-type impurity in the source region 30 is $1\times10^{19}$ cm$^{-3}$ to $1\times10^{21}$ cm$^{-3}$. The depth of the source region 30 is shallower than the depth of the body region 28 and is, for example, 0.1 µm to 0.3 µm.

The p+-type first body contact region 32a is provided between the source electrode 12 and the body region 28. The first body contact region 32a is provided in the silicon carbide layer 10 between the first gate electrode 18a and the second gate electrode 18b. The first body contact region 32a is provided at the bottom of the first contact opening 22a.

The first body contact region 32a is in contact with the source electrode 12 on a second contact plane ("CP2" in FIG. 1 and FIG. 3). The distance between the second contact plane CP2 and the drain electrode 14 is shorter than the distance between the first contact plane CP1 and the drain electrode 14. In other words, the second contact plane CP2 exists at a deeper location in the silicon carbide layer 10 in comparison to the location of the first contact plane CP1. An impurity concentration of a p-type impurity in the first body contact region 32a is higher than the impurity concentration of the p-type impurity in the body region 28.

For example, the first body contact region 32a contains aluminum (Al) as a p-type impurity. For example, the impurity concentration of the p-type impurity in the first body contact region 32a is $1\times10^{19}$ cm$^{-3}$ to $1\times10^{21}$ cm$^{-3}$.

For example, the depth (thickness) of the first body contact region 32a is 0.3 µm to 0.6 µm.

For example, the first body contact region 32a can be formed by the following method. The source region 30 is formed in the silicon carbide layer 10 by ion implantation of an n-type impurity. Then, the first contact opening 22a, which passes through the source region 30, is formed by the RIE method. Then, the first and second body contact regions 32a, 32b are formed at the bottom of the first and second contact openings 22a, 22b by ion implantation of a p-type impurity.

The p+-type second body contact region 32b is provided between the source electrode 12 and the body region 28. The second body contact region 32b is provided in the silicon carbide layer 10 between the first gate electrode 18a and the second gate electrode 18b. The second body contact region 32b is provided at the bottom of the second contact opening 22b.

The second body contact region 32b is in contact with the source electrode 12 through the silicide region 12a on a third contact plane ("CP3" in FIG. 3). The distance between the third contact plane CP3 and the drain electrode 14 is shorter than the distance between the first contact plane CP1 and the drain electrode 14. In other words, the third contact plane CP3 is located at a deeper position in the silicon carbide layer 10 in comparison to the location of the first contact plane CP1. The impurity concentration of the p-type impurity in the second body contact region 32b is higher than the impurity concentration of the p-type impurity in the body region 28.

For example, the second body contact region 32b contains aluminum (Al) as the p-type impurity. For example, the impurity concentration of the p-type impurity in the second body contact region 32b is $1\times10^{19}$ cm$^{-3}$ to $1\times10^{21}$ cm$^{-3}$.

For example, a depth of the second body contact region 32b is 0.3 μm to 0.6 μm.

The source region 30 and the body region 28 are located in the silicon carbide layer 10 between the first body contact region 32a and the second body contact region 32b in the extending direction (direction indicated by a white arrow in FIG. 2 and FIG. 3) of the first gate electrode 18a and the second gate electrode 18b. The source region 30 and the body region 28 are also located between the first contact opening 22a and the second contact opening 22b.

The first body contact region 32a and the second body contact region 32b are formed as island-shaped regions separated from each other in the extending direction of the first gate electrode 18a and the second gate electrode 18b.

For example, a width ("w" in FIG. 2) of the first body contact region 32a and the second body contact region 32b in the extending direction of the first gate electrode 18a and the second gate electrode 18b is greater than spacing ("s" in FIG. 2) between the first body contact region 32a and the second body contact region 32b in the extending direction of the first and second gate electrodes 18a, 18b. For example, the width of the first contact opening 22a and the second contact opening 22b in the extending direction of the first gate electrode 18a and the second gate electrode 18b is greater than spacing between the first contact opening 22a and the second contact opening 22b in the extending direction of the first and second gate electrodes 18a, 18b.

For example, the spacing s between the first body contact region 32a and the second body contact region 32b is 1 μm to 10 μm.

The first gate electrode 18a is located such that the drift region 26 is located between the first gate electrode 18a and the drain electrode 14. First gate electrode 18a is provided between the source electrode 12 and the drain electrode 14. The first gate electrode 18a is provided on the first gate insulating film 16a, which is located on the drift region 26 and portions of the body region 28 and source region 30.

The first gate electrode 18a is a conductive layer. For example, the first gate electrode 18a is polycrystalline silicon that contains a p-type impurity or an n-type impurity.

The second gate electrode 18b is located such that the drift region 26 is located between the second gate electrode 18b and the drain electrode 14. The second gate electrode 18b is provided between the source electrode 12 and the drain electrode 14. The second gate electrode 18b is provided on the second gate insulating film 16b, which is located on the drift region 26 and portions of the body region 28 and source region 30.

The second gate electrode 18b is a conductive layer. For example, the second gate electrode 18b is polycrystalline silicon that contains a p-type impurity or an n-type impurity.

The first gate insulating film 16a is provided between the first gate electrode 18a and the body region 28. For example, the first gate insulating film 16a is a silicon oxide film. For example, a high-k insulating film (high-dielectric-constant insulating film) is used as the first insulating film 16a.

The second gate insulating film 16b is provided between the second gate electrode 18b and the body region 28. For example, the second gate insulating film 16b is a silicon oxide film. For example, a high-k insulating film (high-dielectric-constant insulating film) is used as the second gate insulating film 16b.

The first interlayer insulating film 20a is provided on the first gate electrode 18a. For example, the first interlayer insulating film 20a is a silicon oxide film.

The second interlayer insulating film 20b is provided on the second gate electrode 18b. For example, the second interlayer insulating film 20b is a silicon oxide film.

The source electrode 12 is in contact with the source region 30, the first body contact region 32a, and the second body contact region 32b through the silicide regions 16a, 16b. The silicide region 12a, which contains silicide, is provided at the portions of the source regions 30, the first body contact region 32a, and the second body contact region 32b underlying the source electrode 12.

The source electrode 12 contains a metal. For example, the metal, which forms the source electrode 12, has a stacked structure of titanium (Ti) and aluminum (Al). The silicide region 12a is metal silicide. For example, the silicide region 12a is titanium silicide or nickel silicide.

The drain electrode 14 is provided on a rear surface of the silicon carbide layer 10. The drain electrode 14 is in contact with the drain region 24.

For example, the drain electrode 14 contains a metal or a metal semiconductor compound. For example, the drain electrode 14 contains a material selected from the group consisting of nickel silicide, titanium (Ti), nickel (Ni), silver (Ag), and gold (Au).

Hereinafter, description will be given of an operation and an effect of the semiconductor device.

In an n-type MOSFET using silicon carbide, it is preferable to reduce contact resistance between an n-type source region and an electrode to reduce on-state resistance of the device. In addition, it is preferable to reduce contact resistance between a p-type body region and an electrode to improve avalanche resistance of the device.

It is preferable that a contact between a source region and an electrode is provided in the vicinity of a channel region in order to reduce parasitic resistance of the source region. In addition, it is preferable that a contact between the p-type body region and the electrode is provided with a high density in the p-type body region in order to improve hole extraction efficiency when avalanche breakdown occurs. Accordingly, it is preferable that the contact between the source region and the electrode, and the contact between the p-type body region and the electrode are formed to be close to each other in the silicon carbide layer between gate electrodes adjacent to each other.

When spacing between the gate electrodes adjacent to each other is increased so as to increase the contact area of the first electrode 12 with the source regions 30a, 30b and the body contact regions 32a, 33b, the proportion of the device area in the contact area increases. Accordingly, on-state resistance increases. In addition, in a limited contact area, a reduction in a contact resistance between the n-type source region and the electrode, and a reduction in a contact resistance between the p-type body region and the electrode have a trade-off relationship.

In the MOSFET 100 according to this embodiment, the first contact opening 22a and the second contact opening 22b, which are separated in the extending direction (direction indicated by a white arrow in FIG. 2 and FIG. 3) of the first gate electrode 18a and the second gate electrode 18b, are provided. In addition, the first body contact region 32a and the second body contact region 32b are respectively formed at the bottom of the first contact opening 22a and at the bottom of the second contact opening 22b.

In comparison to a case where the first contact opening 22a and the second contact opening 22b are not provided, lateral surfaces of the first contact opening 22a and the second contact opening 22b can be used as a region for contacting the source electrode 12. Accordingly, it is possible to increase the contact area of the source electrode 12 with the body regions 28, the source regions 30 and the body contact regions 32a, 32b without increasing the spacing between adjacent gate electrodes. As a result, it is possible to achieve the MOSFET 100 capable of reduced contact resistance.

Particularly, the first contact opening 22a and the second contact opening 22b are separated from each other in the extending direction of the gate electrodes. Accordingly, lateral surfaces of the openings in the extending direction of the gate electrodes can also be used as a region for obtaining contact with the source electrode 12.

The source region 30 is in contact with the silicide region 12a of the source electrode 12 on the first contact plane CP1. The first contact plane CP1 includes the first region CP1a and the second region CP1b. The second region CP1b is located on lateral surfaces of the first contact opening 22a and the second contact opening 22b. A contact area between the source electrode 12 and the source region 30 is increased by contact with a portion of the silicide region 12a of the source electrode 12 on the sidewall of the openings 22a, 22b extending between the first region CP1a and second region CP1b, and thus contact resistance between the source electrode 12 and the source region 30 is reduced.

In the extending direction of the first gate electrode 18a and the second gate electrode 18b, it is preferable that the width ("w" in FIG. 2) of the first body contact region 32a and the second body contact region 32b is greater than the spacing ("s" in FIG. 2) between the first body contact region 32a and the second body contact region 32b. According to the configuration, the contact area between the source electrode 12 and the body region 28 increases, and thus avalanche resistance is improved.

For example, it is preferable that the spacing s between the first body contact region 32a and the second body contact region 32b is 1 µm to 10 µm. When the spacing s is below the range, there is a concern that the processing of the first contact opening 22a and the second contact opening 22b may become difficult. In addition, when the spacing s is above the range, there is a concern that the contact area between the source electrode 12 and the body region 28 decreases, and thus the avalanche resistance may decrease.

In addition, the MOSFET 100 includes the silicide region 12a at a portion, which is in contact with the source region 30, the first body contact region 32a and the second body contact region 32b, of the source electrode 12. When the silicide region 12a is provided, contact resistance between the source electrode 12 and the source region 30, and contact resistance between the source electrode 12 and the body region 28 are reduced. The silicide region may be omitted, such that the source electrode 12 directly contacts the source regions 20, body regions 28 and first and second contact regions 32a, 32b.

As described above, according to this embodiment, it is possible to achieve the MOSFET 100 capable of reduced contact resistance.

Second Embodiment

This embodiment is different from the first embodiment in that a semiconductor device of this embodiment further includes a first-conductivity-type silicon carbide region provided in the silicon carbide layer between the n+-type source region and the p+-type first body contact region in contact with the first electrode on a fourth contact plane, and in which the first-conductivity-type impurity concentration is higher than the first-conductivity-type impurity concentration of the n−-type drift region, and a first-conductivity-type silicon carbide region provided in the silicon carbide layer between the n+-type source region and the silicon carbide region in contact with the first electrode on a fifth contact plane, and in which a first-conductivity-type impurity concentration is higher than the first-conductivity-type impurity concentration of the n+-type source region. Hereinafter, description of contents redundant to those in the first embodiment will be omitted.

Figure 4:
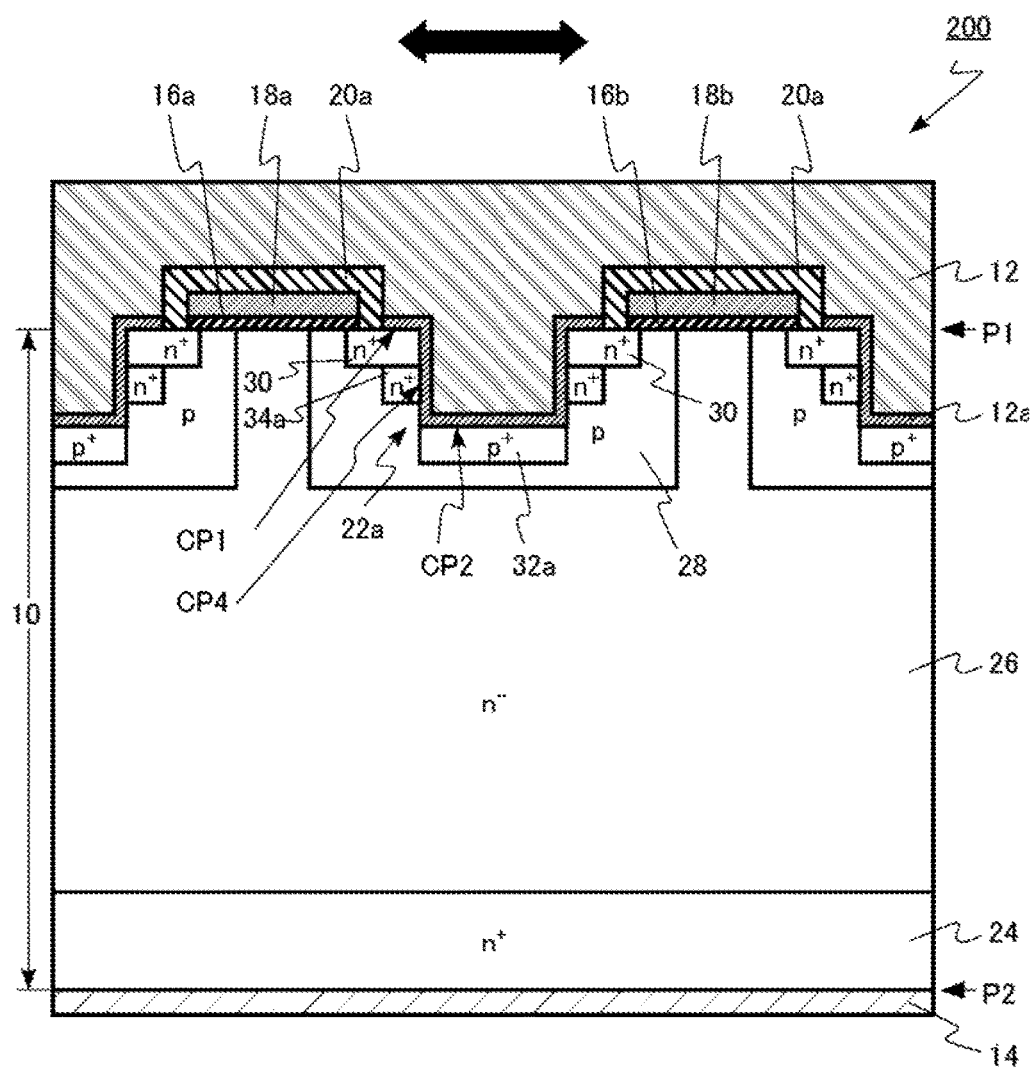
FIG. 4 is a schematic cross-sectional view of a semiconductor device according to a second embodiment.
Figure 5:
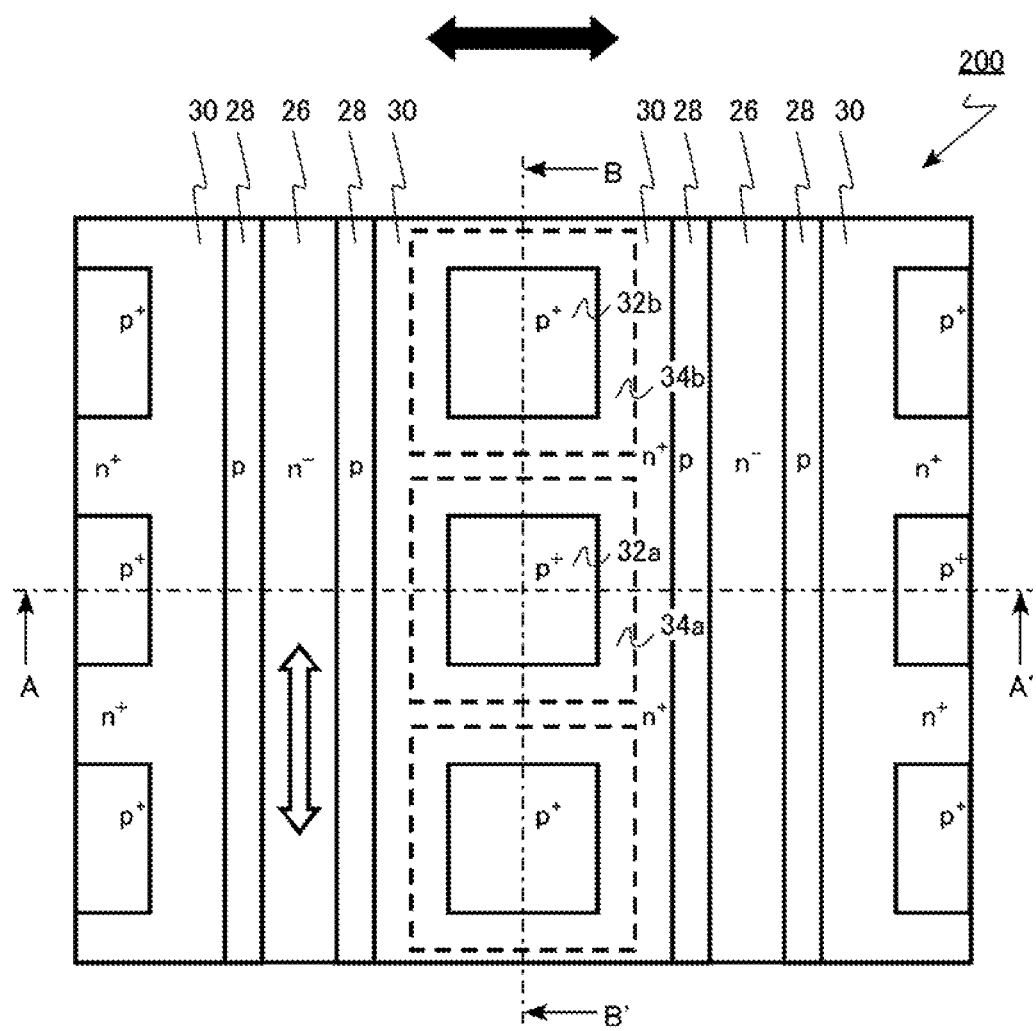
FIG. 5 is a schematic top plan view of the semiconductor device according to the second embodiment.
Figure 6:
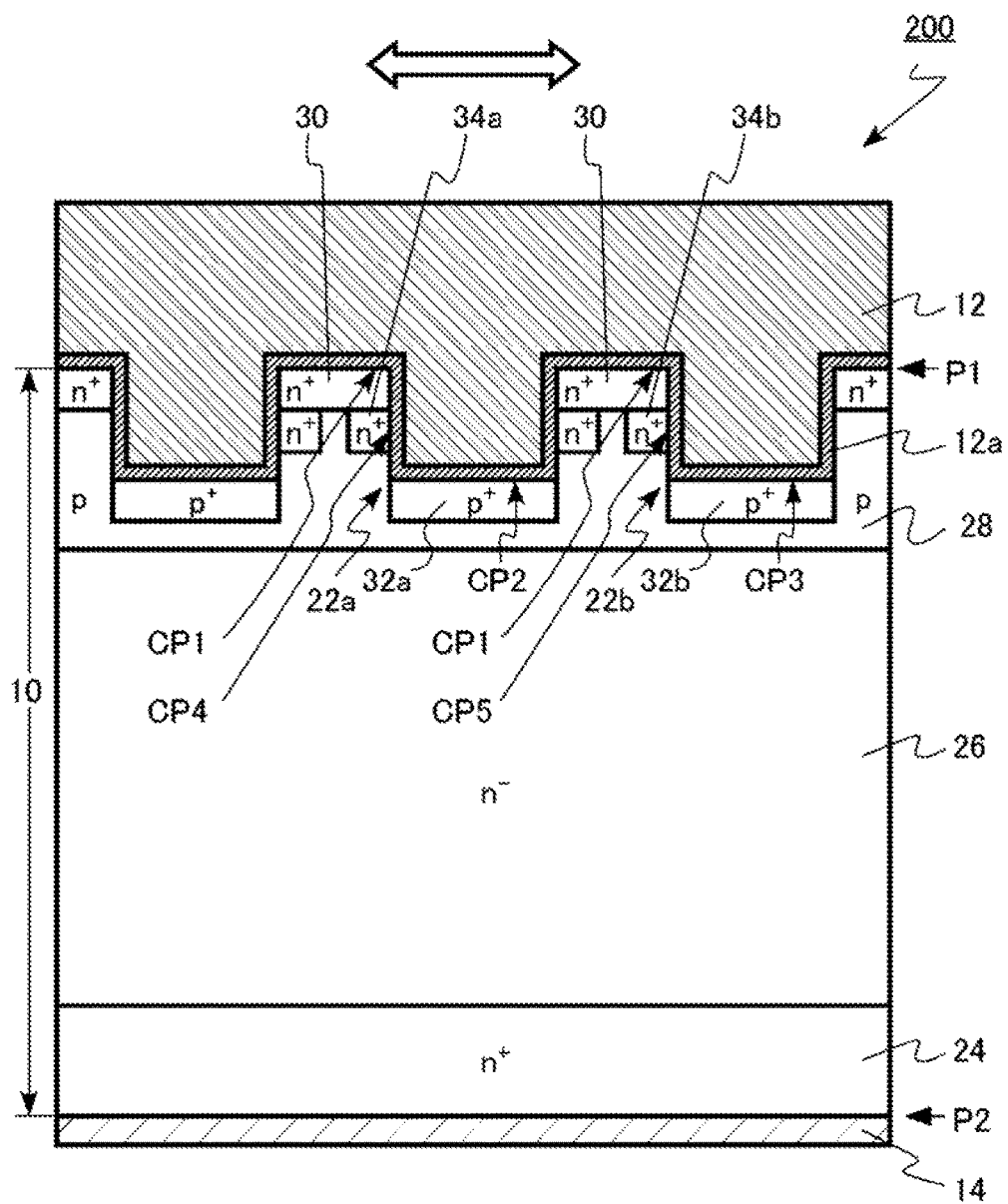
FIG. 6 is a schematic cross-sectional view of the semiconductor device according to the second embodiment.

FIG. 4 is a schematic cross-sectional view of the semiconductor device according to this embodiment. FIG. 5 is a schematic top plan view of the semiconductor device according to this embodiment. FIG. 6 is a schematic cross-sectional view of the semiconductor device according to this embodiment. FIG. 4 is a cross-sectional view taken along line A-A' in FIG. 5. FIG. 6 is a cross-sectional view taken along line B-B' in FIG. 5.

The semiconductor device according to this embodiment is a planar gate-type vertical MOSFET 200 using silicon carbide. Hereinafter, description will be given to a case where the first conductivity type is an n-type, and the second conductivity type is a p-type, as an example.

The MOSFET 200 includes an $n^+$-type first source contact region 34a, and an $n^+$-type second source contact region 34b.

The $n^+$-type first source contact region 34a is provided in the silicon carbide layer 10 between the source region 30 and the first body contact region 32a. The first source contact region 34a is provided at the periphery of the portion of the source electrode 12 extending inwardly of the openings 22a, 22b.

The first source contact region 34a is in contact with the source electrode 12 on a fourth contact plane ("CP4" in FIG. 4 and FIG. 6). The fourth contact plane CP4 is located on the lateral surface of the first contact opening 22a.

For example, the first source contact region 34a contains phosphorous (P) as an n-type impurity. An impurity concentration of the n-type impurity in the first source contact region 34a is higher than the impurity concentration of the n-type impurity in the drift region 26.

For example, the impurity concentration of the n-type impurity in the first source contact region 34a is $1 \times 10^{19}$ cm$^{-3}$ to $1 \times 10^{21}$ cm$^{-3}$. The depth of the first source contact region 34a is shallower than the depth of the body region 28, and is, for example, 0.15 µm to 0.4 µm.

For example, the first source contact region 34a can be formed by the following method. The source region 30 is formed in the silicon carbide layer 10 by ion implantation of an n-type impurity. Then, the first contact opening 22a, which passes through the source region 30, is formed using the RIE method. In addition, the first source contact region 34a is formed on the sidewall surface of the opening by angled ion implantation of an n-type impurity. Then, the opening is additionally etched to remove an n-type impurity region at the bottom of the first source contact region 34a. In addition, the first body contact region 32a is formed at the bottom of the first contact opening 22a by ion implanting a p-type impurity.

The $n^+$-type second source contact region 34b is provided in the silicon carbide layer 10 between the source region 30 and the second body contact region 32b. The second source contact region 34b is provided at the portion of the periphery of the source electrode 12 extending inwardly of the openings 22a, 22b.

The second source contact region 34b is in contact with the source electrode 12 on a fifth contact plane ("CP5" in FIG. 6). The fifth contact plane CP5 is located on a lateral surface (sidewall surface) of the second contact opening 22b.

For example, the second source contact region 34b contains phosphorous (P) as an n-type impurity. An impurity concentration of the n-type impurity in the second source contact region 34b is higher than the impurity concentration of the n-type impurity in the drift region 26.

For example, the impurity concentration of the n-type impurity in the second source contact region 34b is $1 \times 10^{19}$ cm$^{-3}$ to $1 \times 10^{21}$ cm$^{-3}$. A depth of the second source contact region 34b is shallower than the depth of the body region 28, and is, for example, 0.15 μm to 0.4 μm.

The second source contact region 34b can also be formed by the same method as in the first source contact region 34a.

Furthermore, it is preferable that a width of the first source contact region 34a and the second source contact region 34b in a direction (direction indicated by a black arrow in FIG. 4 and FIG. 5) perpendicular to the extension direction of the first gate electrode 18a and the second gate electrode 18b is smaller than the width of the source region 30. The first source contact region 34a and the second source contact region 34b can suppress a short-channel effect of the MOSFET 200.

In the MOSFET 200 according to this embodiment, it is possible to reduce contact resistance between the source electrode 12 and the source region 30 by providing the areas of the fourth contact plane CP4 and the fifth contact plane CP5 where the first and second source contact regions contact the source electrode 12 or the silicide region 12a.

As described above, according to this embodiment, it is possible to achieve the MOSFET 200 capable of further reducing a contact resistance in comparison to the first embodiment.

In the first and second embodiments, description is given of the MOSFET as an example, but the embodiment is also applicable to an insulated gate bipolar transistor (IGBT). In the IGBT, a p$^+$-type collector region is provided instead of the n$^+$-type drain region 24. In addition, the source region 30 is also referred to as an emitter region. In addition, the first electrode serves as an emitter electrode, and the second electrode serves as a collector electrode.

In the first and second embodiments, description is given of the planar gate-type MOSFET as an example, but the embodiment is also applicable to a trench gate-type MOSFET in which a gate electrode is provided in a trench.

In the first and second embodiment, description is given of a case where the crystal structure of SiC is 4H—SiC as an example, but it is also possible to apply the embodiment to a device using SiC having the other crystal structures such as 6H—SiC and 3C—SiC. In addition, a plane other than the (0001) plane is also applicable to the front surface of the silicon carbide layer 10.

In the first and second embodiments, description is given of a case where the first conductivity type is an n-type, and the second conductivity type is a p-type as an example, but it is also possible to employ a configuration in which the first conductivity type is the p type and the second conductivity type is the n type.

In the first and second embodiments, aluminum (Al) is exemplified as the p-type impurity, but it is also possible to use boron (B). In addition, nitrogen (N) and phosphorous (P) are exemplified as the n-type impurity, but it is also possible to apply arsenic (As), antimony (Sb), and the like to the n-type impurity.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device, comprising:
   a first electrode;
   a second electrode;
   a silicon carbide layer located between the first electrode and the second electrode;
   a plurality of gate electrodes interposed between the first electrode and the silicon carbide layer and extending thereon in a first direction and spaced from one another in a second direction; and
   a plurality of openings, having sidewalls and a base extending inwardly of the silicon carbide layer, each opening located between adjacent gate electrodes in the second direction and spaced apart from another opening in the first direction, at least a portion of the first electrode extending inwardly of the openings,
   wherein the silicon carbide layer comprises:
      a first region containing a second conductivity type impurity therein extending around, and under the base of, the openings;
      a second region containing the second conductivity type impurity therein interposed between the portion of the first region extending under the openings and the portion of the first electrode extending inwardly of the openings, wherein the concentration of the second conductivity type impurity is greater in the second region than in the first region;
      a third region containing a first conductivity type impurity therein extending inwardly of the first region from the sidewall of the openings; and
      a sixth region containing the first conductivity type impurity therein, the sixth region extending inwardly of the first region from the sidewall of the openings adjacent to the location of the third region, wherein the third region is interposed between a portion of the sixth region and the first electrode.

2. The semiconductor device according to claim 1, wherein the silicon carbide layer further comprises a fourth region containing the first conductivity type impurity therein located between the first region and the second electrode and between the gate electrodes and the second electrode.

3. The semiconductor device according to claim 2, wherein the concentration of the first conductivity type impurity in the third region is greater than that in the fourth region.

4. The semiconductor device according to claim 2, wherein the first region contacts a gate insulating layer in a location between the fourth region and the third region.

5. The semiconductor device according to claim 2, wherein the first region surrounds a portion of the fourth region.

6. The semiconductor device according to claim 5, further comprising a gate insulating layer interposed between the gate electrodes and the fourth region, and between a portion of the first region surrounding the portion of the fourth region contacting the gate electrodes.

7. The semiconductor device according to claim 5, further comprising a silicide region extending between the first electrode and the first and second regions and portions of the third region.

8. The semiconductor device according to claim 1, wherein:
the silicon carbide layer further comprises a fifth region containing the first conductivity type impurity interposed between the fourth region and the second electrode; and
the concentration of the first conductivity type impurity in the fourth region is less than that in the fifth region.

9. A semiconductor device, comprising:
a first electrode;
a second electrode;
a silicon carbide layer located between the first electrode and the second electrode;
a first gate electrode and a second gate electrode interposed between the first electrode and the silicon carbide layer and extending thereon in a first direction and spaced from one another in a second direction;
a plurality of openings, each opening having at least one sidewall and a base, extending inwardly of the silicon carbide layer, located between the first and second gate electrodes and spaced apart from one another in the first direction, at least a portion of the first electrode extending inwardly of the plurality of openings,
wherein the silicon carbide layer comprises:
a first region containing a second conductivity type impurity therein extending around, and under the base of, the openings;
a second region containing a second conductivity type impurity therein interposed between the portion of the first region extending under the openings and the portion of the first electrode extending inwardly of the openings, wherein the concentration of the second conductivity type impurity is greater in the second region than in the first region; and
a third region containing a first conductivity type impurity therein extending inwardly of the first region extending from the sidewall of the openings in the second direction, and
wherein the width of the openings in the first direction is greater than the distance between the openings in the first direction.

10. The semiconductor device according to claim 9, wherein the silicon carbide layer further comprises a fourth region containing the first conductivity type impurity therein located between the first region and the second electrode and between the first and second gate electrodes and the second electrode.

11. The semiconductor device according to claim 10, wherein the first region surrounds a portion of the fourth region.

12. The semiconductor device according to claim 11, further comprising a gate insulating layer interposed between the first gate electrode and the fourth region, and between a portion of the first region surrounding the portion of the fourth region contacting the first gate electrode.

13. The semiconductor device according to claim 11, further comprising a silicide region extending between the first electrode and the first and second regions and portions of the third region.

14. The semiconductor device according to claim 9, wherein:
the silicon carbide layer further comprises a fifth region containing the first conductivity type impurity interposed between the fourth region and the second electrode; and
the concentration of the first conductivity type impurity in the fourth region is less than that in the fifth region.

15. A semiconductor device, comprising:
a first electrode;
a second electrode;
a silicon carbide layer, at least a portion of which is located between the first electrode and the second electrode;
a plurality of gate electrodes located on the surface of the silicon carbide layer opposite to the surface thereof facing the first electrode, the gate electrodes extending along the surface of the silicon carbide layer in a first direction and spaced apart in a second direction; and
a plurality of contact openings extending into the surface of the silicon carbide layer, the contact openings located between the gate electrodes and spaced apart in the first direction,
wherein the silicon carbide layer comprises:
a first silicon carbide region containing a first conductivity type impurity therein located between the first and the second electrodes;
a second silicon carbide region containing a second conductivity type impurity therein located over a portion of the first silicon carbide region, wherein a portion of the first silicon carbide region extends therethrough;
a third silicon carbide region containing the second conductivity type impurity therein located between the second silicon carbide region and the base of one of the plurality of contact openings; and
a fourth silicon carbide region containing the first conductivity type impurity therein, the fourth silicon carbide region extending inwardly of the second silicon carbide region from a sidewall of one of the plurality of contact openings and terminating within the second silicon carbide region,
wherein the second electrode extends over the gate electrodes and inwardly of the openings in the silicon carbide layer and over the first silicon carbide region in areas thereof between the openings, and
wherein the openings have a width in the first direction and a spacing therebetween in the first direction, and the width is larger than the spacing.

16. A semiconductor device, comprising:
a first electrode;
a second electrode;
a silicon carbide layer, at least a portion of which is located between the first electrode and the second electrode;
a plurality of gate electrodes located on the surface of the silicon carbide layer opposite to the surface thereof facing the first electrode, the gate electrodes extending along the surface of the silicon carbide layer in a first direction and spaced apart in a second direction; and
a plurality of contact openings extending into the surface of the silicon carbide layer, the contact openings located between the gate electrodes and spaced apart in the first direction, wherein the silicon carbide layer comprises:
- a first silicon carbide region containing a first conductivity type impurity therein located between the first and the second electrodes;
- a second silicon carbide region containing a second conductivity type impurity therein located over a portion of the first silicon carbide region, wherein a portion of the first silicon carbide region extends therethrough;
- a third silicon carbide region containing the second conductivity type impurity therein located between the second silicon carbide region and the base of one of the plurality of contact openings;
- a fourth silicon carbide region containing the first conductivity type impurity therein, the fourth silicon carbide region extending inwardly of the second silicon carbide region from a sidewall of one of the plurality of contact openings and terminating within the second silicon carbide region; and
- a fifth silicon carbide region extending inwardly of the second silicon carbide region from the sidewall of one of the plurality of openings, wherein the fourth silicon carbide layer is interposed between the fifth silicon carbide layer and a portion of the second electrode, and wherein the second electrode extends over the gate electrodes and inwardly of the openings in the silicon carbide layer and over the first silicon carbide region in areas thereof between the openings.

* * * * *